(12) United States Patent
Semenic et al.

(10) Patent No.: US 11,060,805 B2
(45) Date of Patent: Jul. 13, 2021

(54) THERMAL INTERFACE MATERIAL SYSTEM

(71) Applicant: TELEDYNE SCIENTIFIC & IMAGING, LLC., Thousand Oaks, CA (US)

(72) Inventors: Tadej Semenic, Thousand Oaks, CA (US); Kyle D. Gould, Los Angeles, CA (US); Avijit Bhunia, Newbury Park, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 443 days.

(21) Appl. No.: 14/967,087

(22) Filed: Dec. 11, 2015

(65) Prior Publication Data
US 2016/0169598 A1     Jun. 16, 2016

Related U.S. Application Data

(60) Provisional application No. 62/091,039, filed on Dec. 12, 2014.

(51) Int. Cl.
| | |
|---|---|
| *H01L 23/373* | (2006.01) |
| *F28F 21/08* | (2006.01) |
| *F28F 13/00* | (2006.01) |
| *H01L 23/42* | (2006.01) |
| *F28F 21/02* | (2006.01) |

(52) U.S. Cl.
CPC ........ *F28F 13/003* (2013.01); *H01L 23/3733* (2013.01); *H01L 23/3737* (2013.01); *H01L 23/42* (2013.01); *F28F 21/02* (2013.01); *F28F 21/08* (2013.01); *F28F 2013/005* (2013.01); *F28F 2013/006* (2013.01); *H01L 23/373* (2013.01); *H01L 23/3731* (2013.01); *H01L 23/3736* (2013.01)

(58) Field of Classification Search
CPC .. F28F 13/003; H01L 23/373; H01L 23/3737; H01B 1/16; H01B 1/18
USPC ........................................................ 165/185
See application file for complete search history.

(56) References Cited

U.S. PATENT DOCUMENTS

| | | | | |
|---|---|---|---|---|
| 4,233,645 A | * | 11/1980 | Balderes | H01L 23/3733 174/16.3 |
| 4,823,863 A | * | 4/1989 | Nakajima | H01L 23/3733 165/80.4 |
| 5,459,352 A | * | 10/1995 | Layton | H01L 23/3733 257/713 |
| 5,591,034 A | * | 1/1997 | Ameen | H01L 23/3737 257/E23.107 |
| 6,037,658 A | * | 3/2000 | Brodsky | H01L 23/42 257/706 |

(Continued)

*Primary Examiner* — Paul Alvare
(74) *Attorney, Agent, or Firm* — K&L Gates LLP

(57) ABSTRACT

A thermal interface material system includes a thermally conductive porous matrix, the thermally conductive porous matrix having a plurality of interstitial voids, and a thermally conductive colloidal suspension disposed on each side of the thermally conductive porous matrix to inhibit thermal pump-out of the thermally conductive colloidal suspension so that the thermally conductive porous matrix and thermally conductive colloidal suspension collectively form a thermally conductive porous pad.

16 Claims, 2 Drawing Sheets

(56) References Cited

U.S. PATENT DOCUMENTS

| | | | |
|---|---|---|---|
| 7,023,699 B2* | 4/2006 | Glovatsky | H05K 7/20454 165/185 |
| 2003/0082393 A1* | 5/2003 | Ishikawa | C22C 1/1036 428/539.5 |
| 2006/0118791 A1* | 6/2006 | Leu | B82Y 10/00 257/77 |
| 2006/0157223 A1* | 7/2006 | Gelorme | H01L 23/3733 165/80.3 |
| 2008/0023665 A1* | 1/2008 | Weiser | H01L 23/3733 252/71 |
| 2008/0026181 A1* | 1/2008 | Rastogi | H01L 21/4878 428/141 |
| 2009/0269521 A1* | 10/2009 | Tuma | C23C 18/08 428/32.74 |
| 2009/0279255 A1* | 11/2009 | Sauciuc | H05K 7/20163 361/697 |
| 2011/0091352 A1* | 4/2011 | Fang | B22F 1/0018 420/591 |
| 2011/0292613 A1* | 12/2011 | Deng | H01L 23/367 361/720 |
| 2012/0187332 A1* | 7/2012 | Iruvanti | B82Y 30/00 252/73 |
| 2014/0116661 A1* | 5/2014 | Xu | H01L 23/373 165/133 |
| 2014/0345843 A1* | 11/2014 | Kirkor | F28F 23/00 165/185 |
| 2015/0232709 A1* | 8/2015 | Matsui | C09J 9/02 252/514 |
| 2016/0021781 A1* | 1/2016 | Jouanne | H05K 7/2039 361/704 |
| 2016/0146556 A1* | 5/2016 | Chauhan | F28F 21/02 428/312.8 |

* cited by examiner

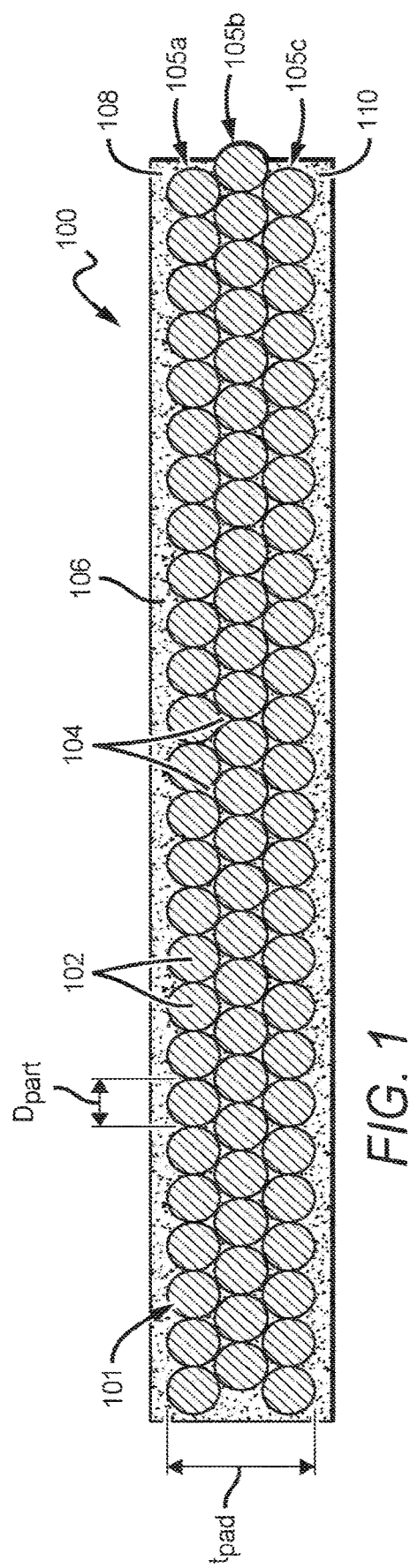
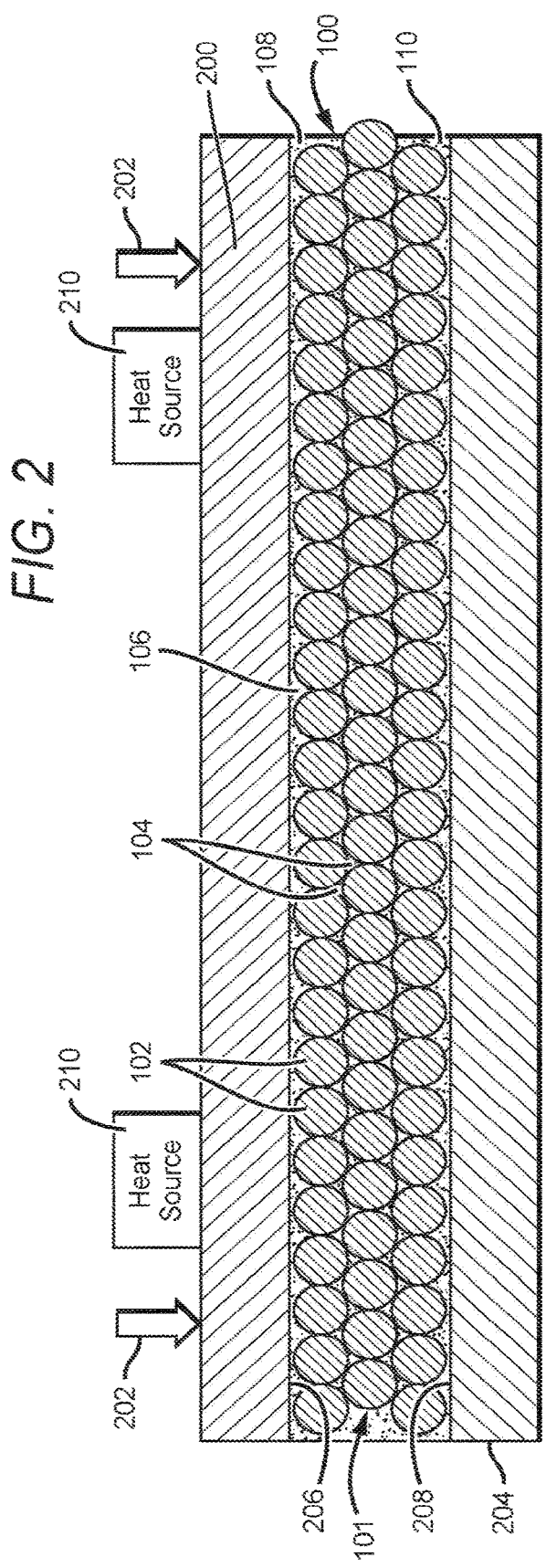

THERMAL INTERFACE MATERIAL SYSTEM

CROSS REFERENCE TO RELATED APPLICATIONS

This application is a continuation of Provisional Application No. 62/091,039, filed Dec. 12, 2014, which is hereby incorporated by reference for all purposes.

BACKGROUND

Field of the Invention

The field of the invention relates to thermal interface materials, and more particularly thermal interface materials for the use between heat sink and heat source.

Description of the Related Art

Thermal interface materials (TIMs) are used to provide good thermal communication between a heat sink and one or more high-power devices such as for power converter modules or radio-frequency (RF) amplifiers or traveling wave tubes or opto-electronics subassemblies, each typically sitting on a thermally-conductive carrier plate or module support plate. Current TIMs trade reliability for thermal resistance. For example, the high-power devices may be bonded to a heat spreader, with thermal greases used within an interface gap between the heat spreader and heat sink to thermally couple the heat spreader to the heat sink with low thermal resistance, but the system may fail prematurely due to the relative motion created between the high-power device and the heat sink or heat spreader (in-plane and out-of-plane) during cycles of powering up or powering down, which tends to squeeze the thermal grease out of the interface gap (i.e., "pump-out"). Thermal grease is also prone to evaporation of the liquid phase of the grease at high temperatures (i.e., "dry out"). More reliable thermal solutions include solid thermal pads that do not suffer from pump out or dry out, but do suffer from high thermal resistance due to a thicker bond line and lower contact area with heat transfer surfaces. Consequently, many power module systems fail due to TIM failure rather than due to failure of the included high-power electronics.

A need continues to exist to increase the reliability of TIMs while keeping thermal resistance low.

SUMMARY

A thermal interface material system may include a thermally conductive porous matrix, the thermally conductive porous matrix having a plurality of interstitial voids, and a thermally conductive colloidal suspension disposed on each side of the thermally conductive porous matrix to inhibit thermal pump-out of the thermally conductive colloidal suspension so that the thermally conductive porous matrix and thermally conductive colloidal suspension collectively form a thermally conductive porous pad. The thermally conductive colloidal suspension may include a high temperature resistant oil. In such embodiments, the thermally conductive colloidal suspension may include a high temperature resistant binder, and may include a plurality of thermally conductive filler particles. The plurality of thermally conductive filler particles may consist of particles selected from the group consisting of aluminum oxide, boron nitride, zinc oxide, silver, and diamond, and may have an average diameter less than 1 micron. In one embodiment, the thermally conductive colloidal suspension may be a thermal grease. In other embodiments, a plurality of thermally conductive particles may be coupled together to form the plurality of interstitial voids, and the thermally conductive particles may include Cu, Al, Ni, or Sn. The thermally conductive particles may form a plurality of interstitial voids having an average pore size of approximately 0.1-20 microns. In still other embodiments, the interstitial voids may be disposed within bonded metal screens, may be holes in a metal foil formed by for example punching or stamping or etching, or may be disposed between graphite nanoplatelets. The porous thermal matrix may have a uniform thickness of between 10 and 100 microns. The thermally conductive porous pad may be thermally coupled between a heat sink and a heat source. In embodiments, the porous thermal pad may also have opposite first and second sides, each of the first and second opposite sides having a substantially planar surface having a roughness value (arithmetic average) ($R_A$) of less than 10 microns. The system may also include top and bottom packaging sheets seated on top and bottom sides of the porous thermal pad, respectively.

A method of assembling a heat sink may include coupling together a plurality of thermally conductive particles to form a thermally conductive porous matrix having a uniform thickness, the plurality of thermally conductive particles establishing a plurality of interstitial voids, and applying a thermally conductive colloidal suspension on each side of the thermally conductive porous matrix and into at least a portion of the plurality of interstitial voids, the thermally conductive porous matrix and thermally conductive colloidal suspension collectively forming a porous thermal pad. The method may also include thermally coupling the porous thermal pad between a heat sink and a heat source. The step of coupling together the plurality of thermally conductive particles may include sintering. The interstitial voids may have a pore size of approximately 0.1-20 microns. In some embodiments, the step of applying the thermally conductive colloidal suspension on each side of the thermally conductive porous matrix may also include pressing the porous thermal pad onto a film of thermally conductive colloidal suspension. In alternatively embodiments, the thermally conductive colloidal suspension may be applied by roller printing, by screen printing, by tape casting, or by spraying.

A thermal interface material system includes a smooth, flat porous matrix infiltrated with a thermally conductive colloidal suspension. The system may also include a heat sink and a heat source so that the smooth, flat porous matrix is thermally coupled between the heat sink plate and heat module plate to form a heat sink. The smooth flat porous matrix may include sintered Cu particles, and the thermally conductive colloidal suspension may include thermal grease.

A thermal interface material system may include a metal foil and first and second layers of thermally conductive colloidal suspension, the first and second layers in thermal communication with first and second sides of the metal foil, respectively. The metal foil may include a thermally conductive porous matrix, the thermally conductive porous matrix having a plurality of interstitial voids. In other embodiments, the metal foil is a solid metal foil. In such embodiments, the system may also include top and bottom layers of thermally conductive particles thermally coupled to top and bottom sides of the solid metal foil, respectively, so that the first and second layers of thermally conductive colloidal suspension are disposed on the top and bottom layers of thermally conductive particles, respectively.

BRIEF DESCRIPTION OF THE DRAWINGS

The components in the figures are not necessarily to scale, emphasis instead being placed upon illustrating the principals of the invention. Like reference numerals designate corresponding parts throughout the different views.

FIG. 1 depicts a cross section of one embodiment of a thermal interface material (TIM) in the form of a thermal interface pad having a colloidal suspension seated on a sintered Cu porous foil;

FIG. 2 depicts the thermal interface pad disposed between an upper heat spreader and lower heat sink;

DETAILED DESCRIPTION

Figure 3:
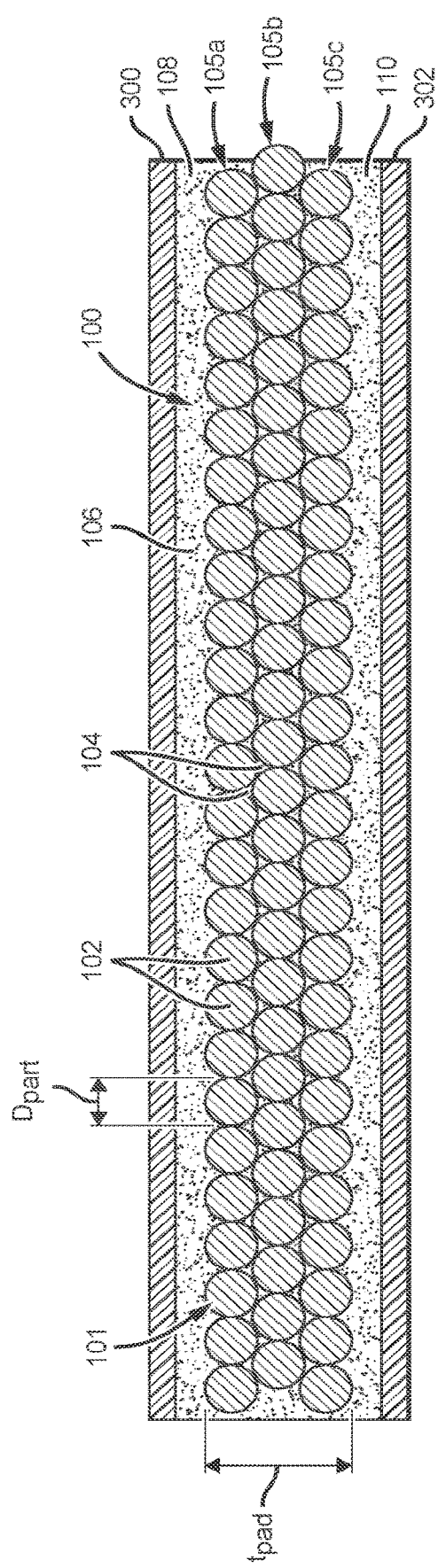
FIG. 3 illustrates the thermal interface pad first illustrated in FIG. 1, and depicts packaging sheet layers for storage and transportation prior to final assembly.

A thermal interface material system is disclosed that uses porous metal foil and high temperature resistant and flowable colloidal suspension on each side of the porous metal foil and within at least some of the interstitial voids of the porous metal foil to define a porous thermal pad. The inventively-sized thickness of the colloidal suspension applied on the porous metal foil and the interstitial voids of the porous matrix inhibit migration of the thermal grease during steady state operation and also during power or temperature cycling, thereby reducing pump-out action of the colloidal suspension and increasing power cycling reliability of the TIM and the system in which it sits.

FIG. 1 depicts one embodiment of a porous thermal pad 100 for use as a TIM between a heat spreader and heat sink. A rigid or semi-rigid thermally conductive porous matrix 101 may have a plurality of thermally conductive particles 102, such as copper (Cu), aluminum (Al), nickel (Ni) or tin (Sn) particles, that are layered or otherwise stacked and coupled together, such as through sintering. Each thermally conductive particle 102 may have a diameter ($D_{part}$) of approximately 1 to 50 microns to form inventive interstitial void pore sizes of approximately 0.1-20 microns (typically 1 to 10 microns) between adjacent thermally conductive particles 102. The semi-rigid porous matrix 101 may have a uniform thickness ($t_{pad}$) of between approximately 10-100 microns and preferably between 20-80 microns. Although the thermally conductive particles 102 are illustrated having a uniform shape and diameter, the invention is not restricted to such a scheme. Rather, the particle dimensions are chosen to create interstitial voids 104 that inhibit migration of a subsequently-injected colloidal suspension 106 out from the particle-formed interstitial voids 104, thereby reducing pump-out action and increasing power cycling reliability during use. For example, instead of generally spherical particles to establish the interstitial voids 104 in the porous matrix 101, the voids 104 may be formed using sintered or diffusion bonded metal screens, such Cu metal screens, layers of metal foil having holes formed by, for example, punching or stamping or etching to create the interstitial voids, or the interstitial voids 104 may be established between graphite nanoplatelets bonded together using pressure.

As used herein, "semi-rigid" refers to materials capable of substantial non-elastic deformation, while "rigid" refers to materials incapable of substantial non-elastic deformation. For example, a rigid porous matrix may be formed of ceramic particles to establish the interstitial voids 104. The ceramic particles are typically not spherical, but rather oblong or having a flake-type shape. The rigid or semi-rigid porous matrix 101 (and resulting porous thermal pad 100) may have opposite first and second sides, each having a smooth planar surface prior to assembly with a heat source and heat sink (see FIG. 2), where "smooth" is defined by a surface that is substantially planar and has a roughness value (arithmetic average) ($R_A$) of less than 10 microns.

The high-temperature resistant and flowable colloidal suspension 106, such as a polymerizable liquid matrix, may be injected or otherwise pressed down to flow between one or more layers (105a, 105b, 105c) of the thermally conductive particles 102 to fill the associated interstitial voids 104 to establish the porous thermal pad 100. In other embodiments, the flowable colloidal suspension 106 may be applied using rollers or by tape casting, spraying, or screen printing. An additional layer 108 of colloidal suspension 106 may be provided on top of the porous thermal pad 100 to further improve thermal communication between a heat source (see FIG. 2) and the thermally conductive particles 102 of the porous thermal pad 100. Similarly, an additional bottom layer 110 of colloidal suspension 106 may be provided on the porous thermal pad 100 to improve thermal communication between a heat sink (see FIG. 2) and the thermally conductive particles 102 of the porous matrix 100. The top and the bottom layers (108, 110) of colloidal suspension 106 may have a thickness of approximately 5-30 microns, with a preferred thickness of approximately 20 microns. The flowable colloidal suspension 106 may be any suitable thermal grease that may reliably operate at temperatures as high as approximately 250° C. and with low evaporation at such temperatures. The flowable colloidal suspension 106 may also be formed from polymerizable liquids such as one or more high temperature oils such as perfluoroalkyl ether, perfluoro-polyether (or fluorinated polyether), perfluoro-polyester, phenal-polyester, phosphate ester, synthetic hydrocarbon, glycol ether, glycerin, polyethylene glycol synthetic oil, polyalphaolefin, fluorinated silicone, chlorinated silicone, stearic acid and with one or more binders such as high temperature epoxy resin or thermoplastic resin. As used herein, "high temperature" means temperatures greater than approximately 200° C. The colloidal suspension may have a high thermal conductivity filler formed from submicron sized particles of zinc oxide (preferred), boron nitride, silver, diamond, aluminum oxide or other high-temperature resistant and thermally conductive rigid material. The filler may have an average diameter of 0.1 to 5 microns. The volume fraction of the filler may be anywhere between 1 and 50 volume percent. The colloidal suspensions described above may have a viscosity of less than approximately 100 Pascal-seconds.

During operation, the colloidal suspension 106 increases the effective thermal contact area of the conductive particles 102 (such as in layers 105a, 105c) with the heat transfer surfaces (see below), while the porous matrix 101 and associated interstitial voids 104 reduce colloidal suspension pump-out of the colloidal suspension 106 resulting in increased power cycling capability and reliability. Consequently, the colloidal suspension 106 may not extend throughout the entire interior of the porous matrix 101, as its primary purpose is to facilitate thermal communication at the structure interfaces.

In one embodiment, the porous thermal pad 100 has a porous matrix 101 formed of 10-micron diameter sintered copper particles 102 layered to form a 50 micron thick porous matrix 101, with the porous matrix 101 injected with a colloidal suspension 106 that is thermal grease. The top layer 108 and bottom layer 110 of colloidal suspension 106 may be approximately 5-30 microns thick.

FIG. 2 illustrates another embodiment of a heat sink system that uses the porous thermal pad 100 as a low thermal resistance TIM between a heat spreader and a heat sink. The heat spreader, such as a thermally-conductive module support plate 200, is illustrated having arrows 202 on each end to indicate a compressive force between the porous thermal pad 100 and a heat sink 204. Preferably, the porous thermal pad 100 is compressed between the module support plate 200 and the heat sink 204 using, for example, screws, clamps or other compression means indicated by the arrows 202. The module support plate 200 and the heat sink 204 are illustrated having their respective inner flat surfaces 206, 208 seated on the porous thermal pad 100, each of the first and second sides (206, 208,) having a smooth substantially planar surface with a roughness value (arithmetic average) ($R_A$) of less than 10 microns. The top layer 108 of colloidal suspension 106 may provide good thermal communication between the porous matrix 101 and the module support plate 200, and the bottom layer 110 of colloidal suspension 106 may provide good thermal communication between the porous matrix 101 and the heat sink 204.

The assembly method for the heat sink system may include forming a plurality of thermally conductive particles 102 into a pad preferentially having a uniform thickness ($t_{pad}$), sintering the particles 102 to form the porous thermal matrix 101 having interstitial voids 104, and applying colloidal suspension 106 on the surface of the porous thermal pad 101. The method may include providing colloidal suspension 106 within at least a first layer of the interstitial voids 104. The resulting porous thermal pad 100 may then be compressed between the heat sink plate 204 and the heat source plate 200. One or more heat sources 210 may be disposed in thermal communication with the heat source plate 200. By way of example and not limitation, types of heat sources may include power converter modules (typically including MOSFETs or bipolar transistors), radio-frequency (RF) amplifiers, light-generating opto-electronics subassemblies, computer CPUs or other high-power devices. In such assemblies, the interstitial voids 104 may have a pore size of approximately 0.1-20 microns, and the injecting step may be accomplished by pressing the porous metal foil onto a film of thermally conductive colloidal suspension.

In FIG. 3, top and bottom packaging sheets (300, 302) may be temporarily seated on top and bottom layers (108, 110) of the colloidal suspension 106, respectively, to facilitate transport of the porous thermal pad 100 and colloidal suspension 106 prior to final system assembly. The packaging sheets (300, 302) are also utilized to remove excess colloidal suspension 106 from the top and the bottom of porous matrix 101 after storage and/or transportation and before assembly. For example, top and bottom layers (108, 110) of colloidal suspension 106 may be applied to a thickness of approximately 50 microns prior to assembly of top and bottom packaging sheets (300, 302). As the top and bottom packaging sheets (300, 302) are removed before assembly with further components (not shown), a portion of the colloidal suspension 106 may remain with the top and bottom packaging sheets (300, 302), resulting in an advantageous colloidal suspension thickness of approximately 20 microns remaining for the top and bottom layers (108, 110).

Figure 4:
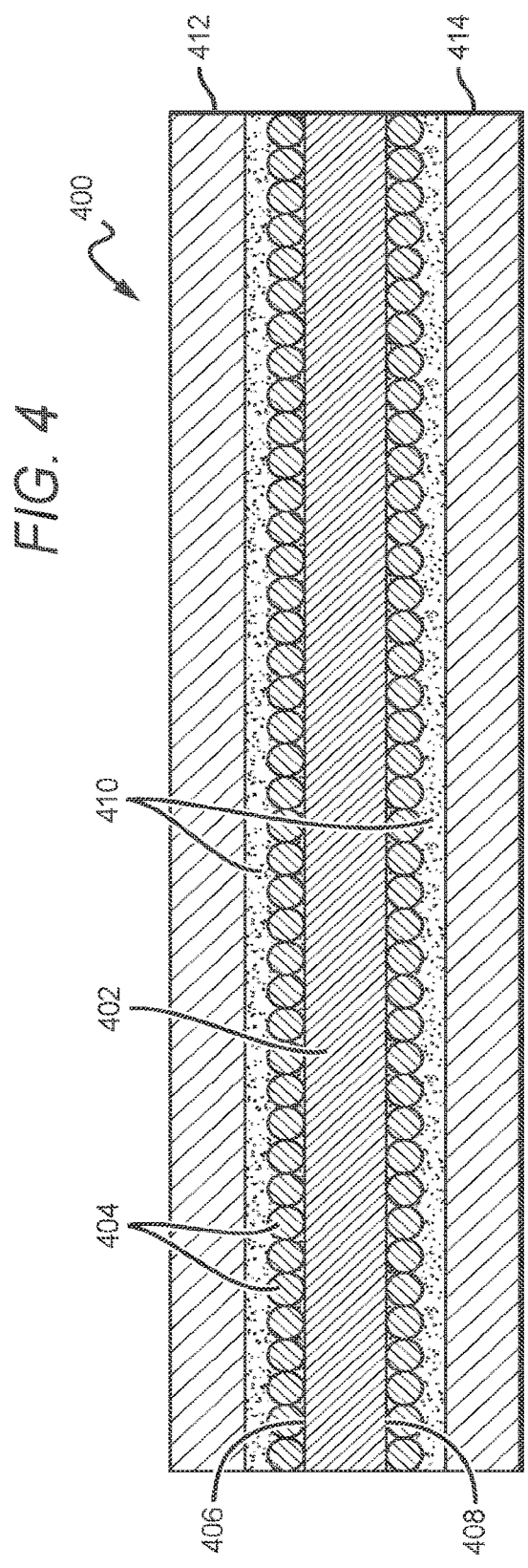
FIG. 4 illustrates a solid metal foil sintered between top and bottom Cu particle layers, with voids formed between the Cu particles.

FIG. 4 depicts a cross section of another embodiment of a porous thermal pad 400 that is formed from solid metal foil 402 and thermally conductive particles 404 that are bonded to top and bottom surfaces (406, 408) of solid metal foil 402. Colloidal suspension 410 is applied on the top and bottom surfaces (406, 408) of the metal foil 402 to cover the thermally conductive particles 404. Metal foil 402 may have a thickness of approximately 10 to 30 microns, metal particles 404 may have a diameter of approximately 1-10 microns and colloidal suspension 410 thickness may be less than 20 microns (measured from the surface of the metal foil 402). The porous thermal pad 400 may be compressed between a power module base plate 412 and heat sink 414 to provide good thermal communication between them (412, 414). The metal foil in this embodiment separates colloidal suspension into two layers reducing the effective gap for pump out to a half of what it would be without the metal foil. In one embodiment metal foil 402 does not include thermally conductive particles 404 and colloidal suspension is applied on each side of the metal foil 402. In one implementation of this embodiment, the solid metal foil may have no additional surface roughness and colloidal suspension is applied on each side of the metal foil.

While various implementations of the embodiments have been described, it will be apparent to those of ordinary skill in the art that many more embodiments and implementations are possible that are within the scope of this invention.

What is claimed is:

1. A thermal interface material system, comprising:
   a thermally conductive porous matrix comprising a plurality of thermally conductive particles coupled together to define a plurality of particle formed interstitial voids, wherein the plurality of interstitial voids has an average pore size of 0.1 to 20 microns and the thermally conductive particles have a diameter of 1 to 50 microns; and
   a thermally conductive colloidal suspension disposed on a first side of the thermally conductive porous matrix to form a first layer of colloidal suspension, on a second side of the thermally conductive porous matrix to form a second layer of colloidal suspension, and within at least some of the plurality of interstitial voids to inhibit migration of the thermally conductive colloidal suspension; and
   wherein the thermally conductive porous matrix and thermally conductive colloidal suspension collectively form a thermally conductive porous pad.

2. A thermal interface material system, comprising:
   a smooth, flat porous matrix infiltrated with a thermally conductive colloidal suspension, thereby inhibiting the migration of the thermally conductive colloidal suspension;
   wherein the porous matrix comprises a plurality of thermally conductive particles coupled together to define a plurality of particle formed interstitial voids, wherein the plurality of interstitial voids has an average pore size of 0.1 to 20 microns and the thermally conductive particles have a diameter of 1 to 50 microns;
   the thermally conductive colloidal suspension disposed on a first side of the thermally conductive porous matrix to form a first layer of colloidal suspension and on a second side of the thermally conductive porous matrix to form a second layer of colloidal suspension.

3. The system of claim 1, wherein the plurality of interstitial voids has an average pore size of 1 to 10 microns.

4. The system of claim 1, wherein the porous matrix has a uniform thickness of between 10 and 100 microns.

5. The system of claim 2, wherein the plurality of interstitial voids has an average pore size of 1 to 10 microns.

6. The system of claim 2, wherein the porous matrix has a uniform thickness of between 10 and 100 microns.

7. The system of claim 4, wherein each of the first layer and second layer is 5 to 30 microns thick.

8. The system of claim 7, wherein the porous matrix has a uniform thickness of between 20 and 80 microns.

9. The system of claim 6 wherein each of the first layer and the second layer is 5 to 30 microns thick.

10. The system of claim 9, wherein the porous matrix has a uniform thickness of between 20 and 80 microns.

11. The system of claim 2, wherein the first side and the second side have a surface roughness of less than 10 microns.

12. A thermal interface material system, comprising:
   a thermally conductive porous pad comprising:
      a planar thermally conductive porous matrix comprising thermally conductive particles coupled together to define interstitial voids, wherein the interstitial voids have an average pore size of 1 to 10 microns, the thermally conductive particles have a diameter of 1 to 50 microns, and the thermally conductive porous matrix has a uniform thickness of between 10 and 100 microns; and
      a thermally conductive colloidal suspension disposed on a first side of the thermally conductive porous matrix to form a first layer of colloidal suspension, on a second side of the thermally conductive porous matrix to form a second layer of colloidal suspension, and within at least some of the plurality of interstitial voids.

13. The system of claim 12, wherein each of the first layer and the second layer is 5 to 30 microns thick.

14. The system of claim 13, wherein the porous matrix has a uniform thickness of between 20 and 80 microns.

15. The system of claim 13, wherein the first side and the second side have a surface roughness of less than 10 microns.

16. The system of claim 1, wherein the thermally conductive porous matrix is formed by layering or stacking the plurality of thermally conductive particles.

* * * * *